US007825670B2

(12) United States Patent
Nie et al.

(10) Patent No.: US 7,825,670 B2

(45) Date of Patent: Nov. 2, 2010

(54) CAPACITANCE MEASURING APPARATUS FOR CAPACITOR

(75) Inventors: Jun Nie, Shenzhen (CN); Pei Tang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 250 days.

(21) Appl. No.: 12/036,271

(22) Filed: Feb. 24, 2008

(65) Prior Publication Data

US 2009/0128165 A1 May 21, 2009

(30) Foreign Application Priority Data

Nov. 15, 2007 (CN) ........................ 2007 1 0202561

(51) Int. Cl.
*G01R 27/26* (2006.01)

(52) U.S. Cl. ........................ 324/678; 324/658; 324/686

(58) Field of Classification Search .................. 324/678
See application file for complete search history.

(56) References Cited

U.S. PATENT DOCUMENTS 6,191,723 B1 * 2/2001 Lewis ......................... 341/166
6,356,086 B1 * 3/2002 Cook et al. ................. 324/659
6,750,800 B2 * 6/2004 Yoshinaga .................. 341/172
7,173,438 B2 * 2/2007 Pooranakaran et al. ...... 324/678
7,236,145 B2 * 6/2007 Park ............................ 345/11
2004/0124999 A1 * 7/2004 Kim et al. ..................... 341/15

FOREIGN PATENT DOCUMENTS

CN 2766247 Y 3/2006
JP 06-331669 A 12/1994

* cited by examiner

*Primary Examiner*—Timothy J Dole
*Assistant Examiner*—John Zhu
(74) *Attorney, Agent, or Firm*—Frank R. Niranjan

(57) ABSTRACT

A measuring apparatus for measuring capacitance of a capacitor includes a microprocessor, a control circuit coupled to the capacitor, and an Analog-to-Digital (A/D) converting circuit. The control circuit receives a control signal from the microprocessor, and outputs an analog voltage signal of the capacitor, and the control circuit charges/discharges the capacitor according to the control signal. The A/D converting circuit receives the analog voltage signal from the control circuit, and outputs a digital voltage signal. The microprocessor receives the digital voltage signal from the A/D converting circuit, and calculates capacitance of the capacitor according to the digital voltage signal and charge/discharge time.

3 Claims, 2 Drawing Sheets

CAPACITANCE MEASURING APPARATUS FOR CAPACITOR

BACKGROUND

1. Field of the Invention

The present invention relates to measuring apparatuses, and particularly to a capacitance measuring apparatus for measuring capacitance of a capacitor.

2. Description of Related Art

Capacitors are often used for storing a charge, wave filtering, and decoupling in various pieces of equipment. Electronic equipment such as mobile phones and notebook computers require high quality capacitors. So the capacitors need to be measured before being used in these electronic equipments. Conventional measuring apparatuses often use a capacitance-bridge method to measure capacitance of the capacitors. However, the capacitance-bridge method is adapted to measure low capacitance capacitors. When the capacitance of the capacitors is high, the measuring precision is not high enough.

What is needed, therefore, is to provide a capacitance measuring apparatus for precisely measuring capacitance of a capacitor.

SUMMARY

An exemplary measuring apparatus for measuring capacitance of a capacitor, includes a microprocessor, a control circuit coupled to the capacitor, and an Analog-to-Digital (A/D) converting circuit. The control circuit receives a control signal from the microprocessor, and outputs an analog voltage signal of the capacitor, and the control circuit charges/discharges the capacitor according to the control signal. The A/D converting circuit receives the analog voltage signal from the control circuit, and outputs a digital voltage signal. The microprocessor receives the digital voltage signal from the A/D converting circuit, and calculates capacitance of the capacitor according to the digital voltage signal and charge/discharge time.

Other advantages and novel features of the present invention will become more apparent from the following detailed description of preferred embodiment when taken in conjunction with the accompanying drawings, in which:

DETAILED DESCRIPTION

Figure 1:
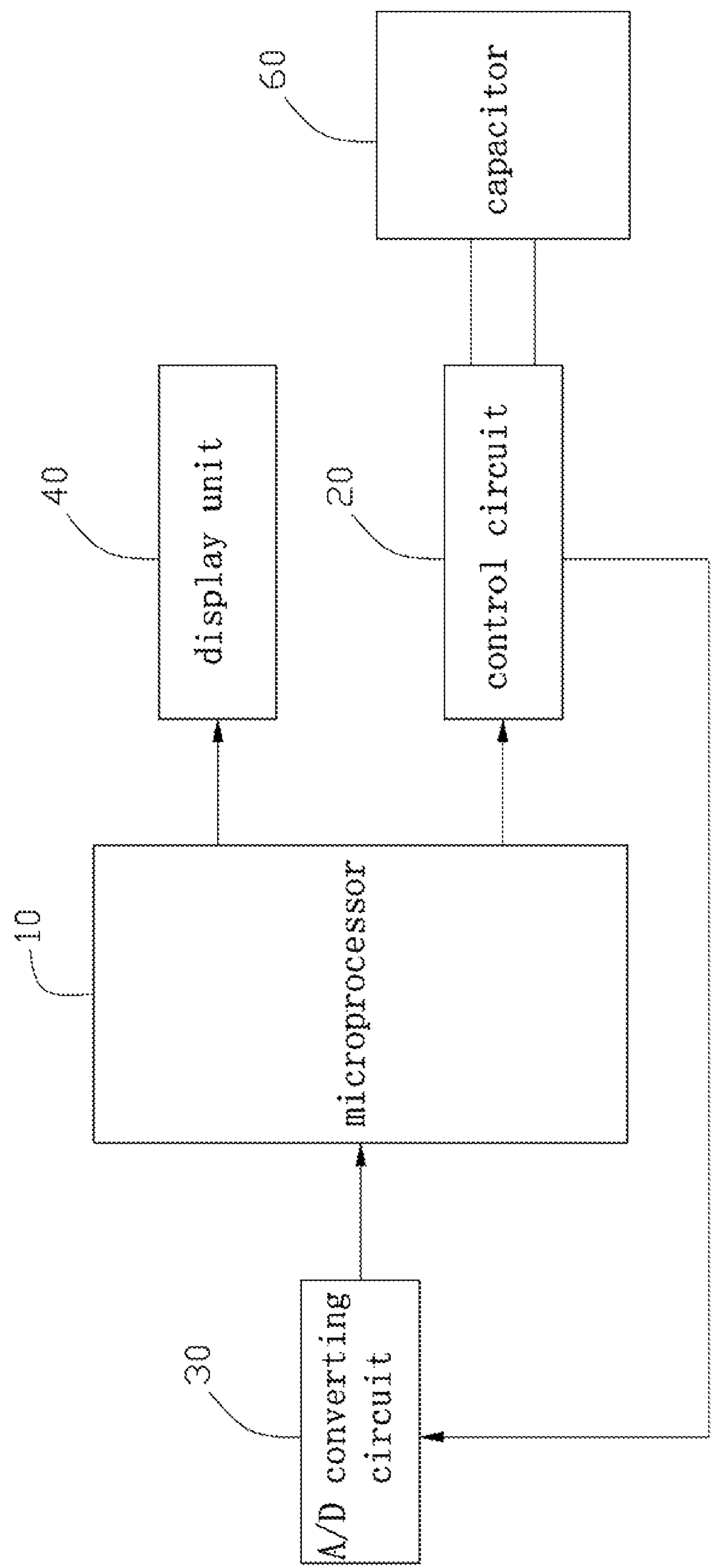
FIG. 1 is a block diagram of an embodiment of a capacitance measuring apparatus in accordance with the present invention.
Figure 2:
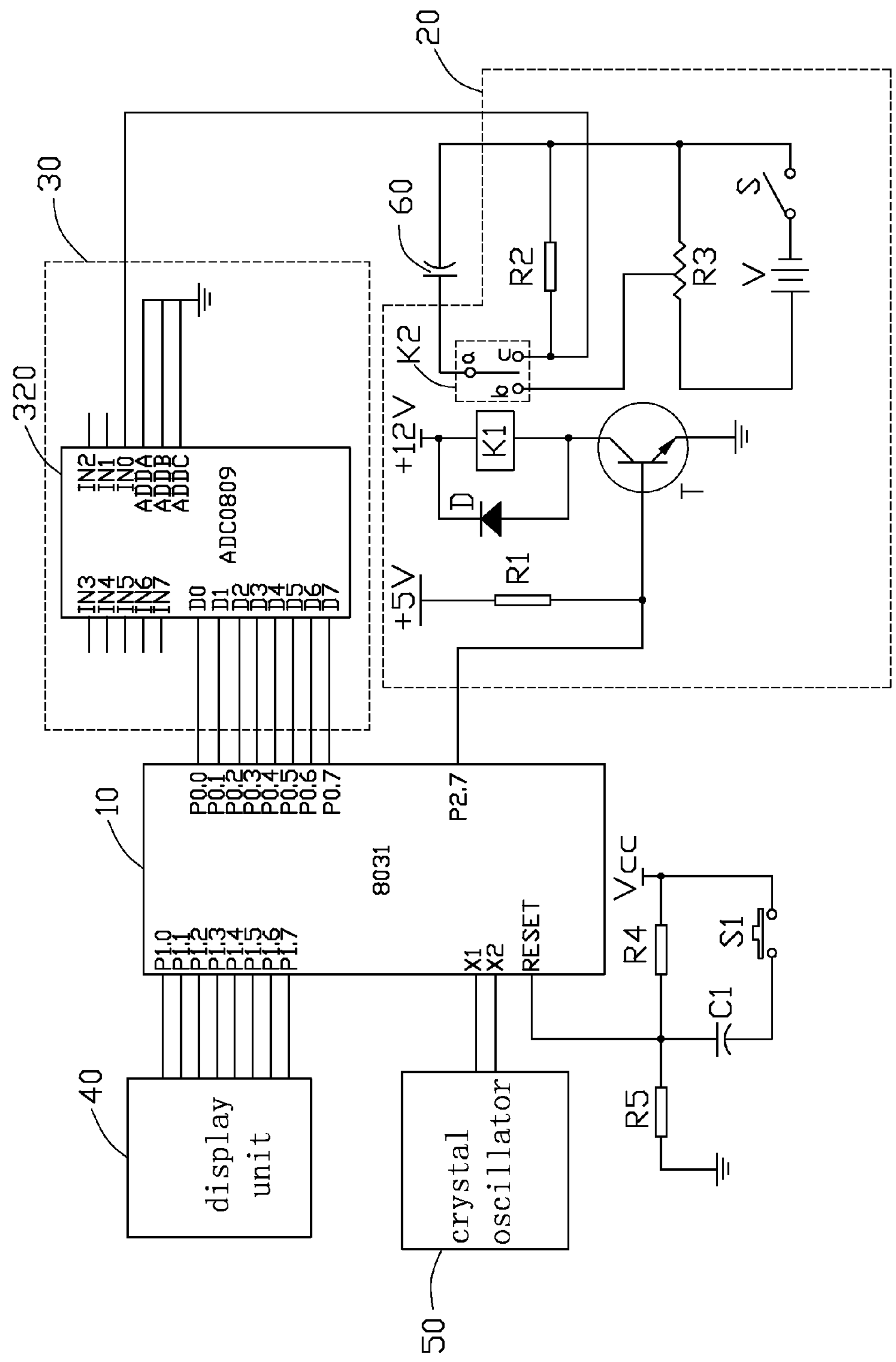
FIG. 2 is a circuit diagram of the capacitance measuring apparatus of FIG. 1.

Referring to FIGS. 1 and 2, a capacitance measuring apparatus in accordance with an embodiment of the present invention includes a microprocessor 10, a control circuit 20, an Analog-to-Digital (A/D) converting circuit 30, and a display unit 40. The capacitance measuring apparatus is configured for measuring capacitance of a capacitor 60.

The microprocessor 10 is a 8031 series single chip microcomputer (SCM) includes I/O ports P0.0~P0.7 acting as data input terminals, I/O ports P1.0~P1.7 acting as data output terminals, an I/O port P2.7 acting as a control terminal, an oscillating input terminal X1, an oscillating output terminal X2, and a reset terminal RESET.

The control circuit 20 includes a transistor T, a relay, a diode D, a battery V, resistors R1, R2, a variable resistor R3, and a switch S. The relay comprises a coil K1, and a normally-open contact K2 having a dynamic contact point a, a first static contact point b, and a second static contact point c.

The base of the transistor T is coupled to the control terminal P2.7 of the microprocessor 10 to receive a control signal, and is coupled to a 5-volt power supply via the resistor R1. The collector of the transistor T is coupled to a 12-volt power supply via the coil K of the relay, and is coupled to the anode of the diode D. The cathode of the diode D is coupled to the 12-volt power supply. The emitter of the transistor T is coupled to ground. The anode of the battery V is coupled to one terminal of the variable resistor R3. The cathode of the battery V is coupled to another terminal of the variable resistor R3 via the switch S. An adjusting terminal of the variable resistor R3 is coupled to the first static contact point b of the normally-open contact K2. The anode of the capacitor 60 and one terminal of the second resistor R2 are respectively coupled to the dynamic contact point a, and the second static contact point c of the normally-open contact K2. The cathode of the capacitor 60 and another terminal of the second resistor R2 are coupled to another terminal of the variable resistor R3.

[001 2] The A/D converting circuit 30 is a ADC0809 series A/D converter 320 includes analog signal input terminals IN0~IN7, channel selecting terminals ADDA, ADDB, ADDC, and digital signal output terminals D0~D7. The channel selecting terminals ADDA, ADDB, ADDC can be set to different voltage levels. One of the analog signal input terminals IN0~IN7 is selected to receive analog voltage signal according to different voltage levels received at the channel selecting terminals ADDA, ADDB, ADDC.

In this embodiment, the logic 1 state corresponds to the logic high level, the logic 0 state corresponds to the logic low level. For example, when voltage levels received at the channel selecting terminals ADDA, ADDB, and ADDC are respectively 0, 0, 0, the analog signal input terminal IN0 is selected. When voltage levels received at the channel selecting terminals ADDA, ADDB, and ADDC are respectively 1, 1, 1, the analog signal input terminal IN7 is selected. In this embodiment, the channel selecting terminals ADDA, ADDB, and ADDC are grounded. Therefore the analog signal input terminal IN0 is selected to receive analog voltage signal, and is coupled to the second static contact point c of the normally-open contact K2.

The digital signal output terminals D0~D7 are respectively coupled to the data input terminals P0.0~P0.7 of the microprocessor 10. The data output terminals P1.0~P1.7 of the microprocessor 10 are coupled to the display unit 40. The oscillating input terminal X1 and the oscillating output terminal X2 are coupled to a crystal oscillator 50 to get a steady operation frequency. The reset terminal RESET of the microprocessor 10 is coupled to an anode of a capacitor C1, and is coupled to a power supply Vcc and ground respectively via resistors R4, R5. The cathode of the capacitor C1 is coupled to the power supply Vcc via a reset switch S1.

In use, the switch S is turned on and the microprocessor 10 outputs a low level voltage signal to the base of the transistor T. The transistor T turns off and the coil K1 of the relay does not work. The dynamic contact point a, and the first static contact point b of the normally-open contact K2 are connected. The battery V, the variable resistor R3, and the capacitor 60 form a charge loop. The battery V charges the capacitor 60 through the variable resistor R3. When the capacitor 60 is fully charged, the microprocessor 10 outputs a high level voltage signal to the base of the transistor T. The transistor T turns on and the coil K1 of the relay works. The dynamic contact point a, and the second static contact point c of the normally-open contact K2 are connected. The capacitor 60 and the resistor R2 form a discharge loop. The capacitor 60 discharges through the resistor R2. The second static contact point c outputs analog voltage signals of the capacitor 60 during the discharge process.

The A/D converter 320 receives the analog voltage signals at the analog signal input terminal IN0, and outputs digital voltage signals at the digital signal output terminals D0~D7. The microprocessor 10 receives the digital voltage signals, and records discharge time through the data input terminals P0.0~P0.7. The microprocessor 10 is programmed to calculate capacitance of the capacitor 60 with this formula:

$$V_c = VCC(1-e^{-t/RC})$$

Wherein, R is the resistance of the resistor R2, C is the capacitance of the capacitor 60, $V_c$ is the voltage on the capacitor 60, VCC is the voltage on the battery V, t is the discharge time of the capacitor 60, and e is the Euler constant.

The capacitance of the capacitor 60 is transmitted to the display unit 40 through the data output terminals P1.0~P1.7 of the microprocessor 10. In this embodiment, the display unit is a light emitting diode (LED) display panel.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A measuring apparatus for measuring capacitance of a capacitor, comprising:

a control circuit configured for receiving a control signal, and outputting an analog voltage signal of the capacitor, wherein the control circuit is coupled to the capacitor and charges/discharges the capacitor according to the control signal;

an Analog-to-Digital (A/D) converting circuit configured for receiving the analog voltage signal of the capacitor, and outputting a digital voltage signal;

a microprocessor having a plurality of data input terminals for receiving the digital voltage signal, a plurality of data output terminals, and a control terminal for outputting the control signal, wherein the control circuit comprises a relay and a first resistor, the first resistor is capable of forming a discharge loop with the capacitor, the relay selectively switches the capacitor to be connected in a charge loop or the discharge loop according to the control signal, the A/D converting circuit receives the analog voltage signal of the capacitor when the capacitor is connected in the discharge loop, the microprocessor calculates capacitance of the capacitor according to the digital voltage signal, the resistance of the first resistor, and discharge time; and a display unit configured for indicating capacitance of the capacitor, wherein the display unit comprises a plurality of data input terminals coupled to the plurality of data output terminals of the microprocessor;

wherein the A/D converting circuit comprises a plurality of analog signal input terminals, a plurality of channel selecting terminals, and a plurality of digital signal output terminals for outputting the digital voltage signal, one of the analog signal input terminals is selected to receive the analog voltage signal according to different voltage levels received at the channel selecting terminals;

wherein the control circuit further comprises a transistor, the base of the transistor is coupled to the control terminal of the microprocessor to receive the control signal, the collector of the transistor is coupled to the relay, the emitter of the transistor is coupled to ground, the transistor is turned on or off by the control signal to control the relay to switch the capacitor to be connected in the charge loop or the discharge loop; and wherein the control circuit further comprises a diode and a second resistor, the charge loop further comprises a battery, a variable resistor, and a switch, the relay comprises a coil, and a normally-open contact having a dynamic contact point, a first static contact point, and a second static contact point, the base of the transistor is further coupled to a power supply via the first second resistor, the collector of the transistor is coupled to another power supply via the coil of the relay, and is coupled to the anode of the diode, the cathode of the diode is coupled to the another power supply, the anode of the battery is coupled to one terminal of the variable resistor, the cathode of the battery is coupled to another terminal of the variable resistor via the switch, an adjusting terminal of the variable resistor is coupled to the first static contact point of the normally-open contact, the anode of the capacitor and one terminal of the first resistor are respectively coupled to the dynamic contact point and the second static contact point of the normally-open contact, the cathode of the capacitor and another terminal of the first resistor are coupled to the another terminal of the variable resistor.

2. The measuring apparatus as claimed in claim 1, wherein the display unit is a light emitting diode display panel.

3. A measuring apparatus for measuring capacitance of a capacitor, comprising:

a control circuit configured for receiving a control signal, and outputting an analog voltage signal of the capacitor, wherein the control circuit is coupled to the capacitor and charges/discharges the capacitor according to the control signal;

an Analog-to-Digital (A/D) converting circuit configured for receiving the analog voltage signal of the capacitor, and outputting a digital voltage signal; and a microprocessor having a plurality of data input terminals for receiving the digital voltage signal, a plurality of data output terminals, and a control terminal for outputting the control signal, wherein the microprocessor calculates capacitance of the capacitor according to the digital voltage signal and discharge time, wherein the control circuit comprises a transistor, a relay, a diode, a battery, a first resistor, a second resistor, a variable resistor, and a switch, the relay comprises a coil, and a normally-open contact having a dynamic contact point, a first static contact point, and a second static contact point, the base of the transistor is coupled to the control terminal of the microprocessor to receive the control signal, and is coupled to a power supply via the first resistor, the collector of the transistor is coupled to another power supply via the coil of the relay, and is coupled to the anode of the diode, the cathode of the diode is coupled to the another power supply, the emitter of the transistor is coupled to ground, the anode of the battery is coupled to one terminal of the variable resistor, the cathode of the battery is coupled to another terminal of the variable resistor via the switch, an adjusting terminal of the variable resistor is coupled to the first static contact point of the normally-open contact, the anode of the capacitor and one terminal of the second resistor are respectively coupled to the dynamic contact point and the second static contact point of the normally-open contact, the cathode of the capacitor and another terminal of the second resistor are coupled to the another terminal of the variable resistor.

* * * * *